United States Patent
Wang et al.

(10) Patent No.: US 11,949,031 B2
(45) Date of Patent: Apr. 2, 2024

(54) P-TYPE BIFACIAL SOLAR CELL WITH PARTIAL REAR SURFACE FIELD PASSIVATION AND PREPARATION METHOD THEREFOR

(71) Applicants: Tongwei Solar (Chengdu) Co., Ltd., Sichuan (CN); Tongwei Solar (Meishan) Co., Ltd., Sichuan (CN)

(72) Inventors: Pu Wang, Sichuan (CN); Yi Xie, Sichuan (CN); Peng Zhang, Sichuan (CN); Shan Sui, Sichuan (CN)

(73) Assignees: Tongwei Solar (Chengdu) Co., Ltd., Sichuan (CN); Tongwei Solar (Meishan) Co., Ltd., Sichuan (CN)

( * ) Notice: Subject to any disclaimer, the term of this patent is extended or adjusted under 35 U.S.C. 154(b) by 0 days.

(21) Appl. No.: 17/764,774

(22) PCT Filed: Aug. 13, 2020

(86) PCT No.: PCT/CN2020/108874
§ 371 (c)(1),
(2) Date: Mar. 29, 2022

(87) PCT Pub. No.: WO2021/093387
PCT Pub. Date: May 20, 2021

(65) Prior Publication Data
US 2022/0328702 A1    Oct. 13, 2022

(30) Foreign Application Priority Data
Nov. 14, 2019   (CN) .......................... 201911115821.9

(51) Int. Cl.
*H01L 31/0288*     (2006.01)
*H01L 31/0216*     (2014.01)
(Continued)

(52) U.S. Cl.
CPC .... *H01L 31/0288* (2013.01); *H01L 31/02168* (2013.01); *H01L 31/022433* (2013.01);
(Continued)

(58) Field of Classification Search
CPC ........... H01L 31/0288; H01L 31/02168; H01L 31/022433; H01L 31/02366; H01L 31/068; H01L 31/0684; H01L 31/1868
See application file for complete search history.

(56) References Cited

U.S. PATENT DOCUMENTS

2010/0240172 A1\*  9/2010  Rana ..................... H01L 31/068
                                                                 438/96
2012/0032310 A1\*  2/2012  Engelhart ............. H01L 31/068
                                                               257/E21.135
(Continued)

FOREIGN PATENT DOCUMENTS

CN        104091842 A        10/2014
CN        105261670 A   \*    1/2016
(Continued)

OTHER PUBLICATIONS

CN-106992229-A English machine translation (Year: 2017).\*
(Continued)

*Primary Examiner* — Andrew J Golden
(74) *Attorney, Agent, or Firm* — Ziegler IP Law Group

(57) ABSTRACT

The present application belongs to the technical field of solar cells, and relates to a p-type bifacial solar cell with partial rear surface field passivation and a preparation method therefor. The solar cell includes a p-type silicon substrate. At the bottom portion of the p-type silicon substrate are arranged, from top to bottom, a silicon oxide passivation layer, an aluminum oxide passivation layer and a rear side silicon nitride anti-reflection layer. A plurality of boron source-doped layers are embedded in the bottom portion of
(Continued)

the p-type silicon substrate. Connected to the bottom of each of the boron source-doped layers is a rear side metal electrode layer, which penetrates each of the silicon oxide passivation layer, the aluminum oxide passivation layer and the rear side silicon nitride anti-reflection layer. The preparation method involves making a plurality of partial slots, by means of a laser, from the lower surface of the rear side silicon nitride anti-reflection layer all the way to the bottom of the p-type silicon substrate, and printing a boron source slurry into the slot region to form a high-low junction structure. The high-low junction structure increases the open-circuit voltage of a rear side cell of the bifacial solar cell. The slot region heavily doped with the boron source slurry is in contact with the metal electrode to form an ohmic contact, which results in a decrease in series resistance and an increase in fill factor, and increases the bifaciality of the cell without decreasing efficiency on the front side.

5 Claims, 1 Drawing Sheet

(51) Int. Cl.
  *H01L 31/0224* (2006.01)
  *H01L 31/0236* (2006.01)
  *H01L 31/068* (2012.01)
  *H01L 31/18* (2006.01)
(52) U.S. Cl.
  CPC .... *H01L 31/02366* (2013.01); *H01L 31/0684* (2013.01); *H01L 31/1868* (2013.01)

(56) References Cited

U.S. PATENT DOCUMENTS

| | | | |
|---|---|---|---|
| 2013/0255765 A1 | 10/2013 | Gee | |
| 2014/0057383 A1* | 2/2014 | Okuuchi | H01L 31/02168 438/71 |
| 2018/0025912 A1* | 1/2018 | Ikegami | H01L 31/068 438/57 |

FOREIGN PATENT DOCUMENTS

| | | | |
|---|---|---|---|
| CN | 106992229 A * | 7/2017 | |
| CN | 107863419 A | 3/2018 | |
| CN | 109585600 A | 4/2019 | |
| CN | 109888060 A | 6/2019 | |
| CN | 107394006 B | 7/2019 | |
| CN | 109980022 A | 7/2019 | |
| CN | 110233189 A | 9/2019 | |
| CN | 110828584 A | 2/2020 | |
| CN | 210778616 U | 6/2020 | |
| WO | WO-2012054426 A2 * | 4/2012 | H01L 31/068 |

OTHER PUBLICATIONS

CN-105261670-A English machine translation (Year: 2016).*
CN-104091842-A English machine translation (Year: 2014).*
Leguijt et al, Low temperature surface passivation for silicon solar cells, Solar Energy Materials and Solar Cells 40 (1996) 297-345 (Year: 1996).*
International Search Report, Application No. PCT/CN2020/108874, dated Oct. 27, 2020, 2 pages.
Written Opinion, Application No. PCT/CN2020/108874, dated Oct. 27, 2020, 5 pages.
Australian Government IP Australia; Examination Report No. 1 for standard patent appication; Application 2020381626, dated Dec. 21, 2022, 3 pages.
European Patent Office; Communication pursuant to Article 94(3) EPC, Application 20888572.3 dated Jun. 15, 2022, 7 pages.
Eurpoean Patent Office, Communication, European Search Report, Application 20888572.3, dated May 5, 2022, 4 Pages.
Jingjing Liu et al "Review of status developments of high efficiency crystalline silicon solar cells" Journal of Physics D: Applied Physics, Institute of Physics Publishing, Bristol, GB, vol. 51 No. 12, Feb. 20, 2018, 13 pages.

* cited by examiner

P-TYPE BIFACIAL SOLAR CELL WITH PARTIAL REAR SURFACE FIELD PASSIVATION AND PREPARATION METHOD THEREFOR

TECHNICAL FIELD

The present disclosure relates to the technical field of solar cell, in particular to a p-type bifacial solar cell with partial rear surface field passivation and preparation method therefor.

BACKGROUND ART

In recent years, the vigorous development of renewable energy has been increasing, and the more popular renewable energy fields include solar energy, wind energy, and tidal energy and the like. Compared with traditional energy, solar energy has the characteristics of simple utilization, safety, and no pollution and the like, and has become the focus of research in the field of renewable new energy. The basic principle of solar cell power generation is the photovoltaic effect, solar cells are new energy devices that convert sunlight into electrical energy, with the increase in the application field of solar power generation, new policies and other preferential issues, the cost of photovoltaic power generation needs to be greatly decreased. Reducing the cost of photovoltaic power generation requires improving efficiency and reducing costs in the field of cell manufacturing. The problems of low conversion efficiency and low power generation of traditional single-sided power generation cells lead to researchers engaged in solar cell research to study bifacial solar cells for saving silicon substrate materials and increasing power generation. Bifacial cells can be used in lakes to form complementary with fishing light, and can also be used in highways, photovoltaic building integration, snowfield and the like, the back surface of the solar cell makes full use of diffuse reflection light to increase the power generation of bifacial solar cells.

For the existing p-type silicon-substrate bifacial solar cell, the lower surface thereof is made of a laminated thin film of aluminium sesquioxide and silicon nitride, the fill factor and the open circuit voltage of the back cell of this bifacial solar cell are relatively low, resulting in low efficiency of the back cell of the bifacial solar cell and relatively low bifacial ratio.

Therefore, how to solve the above-mentioned technical problems has practical significance for those skilled in the art.

SUMMARY

The purpose of the present disclosure is to solve the existing technical problems, the present disclosure provides a p-type bifacial solar cell with partial rear surface field passivation and preparation method therefor.

The present disclosure specifically uses the following technical solutions for achieving the above-mentioned purpose.

A p-type bifacial solar cell with partial rear surface field passivation comprises a p-type silicon substrate, wherein the bottom of the p-type silicon substrate is provided with a silicon oxide passivation layer, an aluminum oxide passivation layer and a back-surface silicon nitride antireflection layer from top to bottom, several boron source doped layers are embedded in the bottom of the p-type silicon substrate, and the bottom of the boron source doped layers is connected with a back-surface metal electrode layer that penetrates through the silicon oxide passivation layer, the aluminum oxide passivation layer and the back-surface silicon nitride antireflection layer, simultaneously.

Further, the top of the p-type silicon substrate is successively provided with a phosphorus source doped layer and a front-surface silicon nitride antireflection layer from bottom to top, the upper surface of the phosphorus source doped layer is provided with several front-surface metal electrode layers at positions one-to-one corresponding to the positions of the boron source doped layers, the front-surface metal electrode layers all penetrate through the front-surface silicon nitride antireflection layer.

Further, the front-surface metal electrode layer and the back-surface metal electrode layer are both Ag or Ag alloy, or Cu or alloy formed by Cu and at least one of Mo, W, Ti, Ni, Al, Mg, Ta, Sn.

Further, the thickness of the p-type silicon substrate is 100-180 um, the thickness of the phosphorus source doped layer is 300-500 nm, the thickness of the front-surface silicon nitride antireflection layer is 60-100 nm, the thickness of the silicon oxide passivation layer is 1-5 nm, and the thickness of the aluminum oxide passivation layer is 2-10 nm, the thickness of the back-surface silicon nitride antireflection layer is 100-150 nm, and the thickness of the boron source doped layer is 500-1500 nm.

Further, the back-surface metal electrode layer and the front-surface metal electrode layer both have the line width of the electrode grids of 40-80 um, and the height of 25-50 um.

A preparation method for a p-type bifacial solar cell with partial rear surface field passivation, which comprises the following steps:

S1: selecting a p-type silicon substrate, cleaning the p-type silicon substrate, and performing surface polishing;

S2: performing low-pressure thermal diffusion on the upper surface of the p-type silicon substrate to prepare a phosphorus source doped layer;

S3: performing ozone oxidation on the lower surface of the p-type silicon substrate to grow a silicon oxide passivation layer;

S4: preparing a front-surface silicon nitride antireflection layer on the upper surface of the phosphorus source doped layer;

S5: preparing an aluminum oxide passivation layer on the lower surface of the silicon oxide passivation layer;

S6: preparing a back-surface silicon nitride antireflection layer on the lower surface of the aluminum oxide passivation layer;

S7: using a laser on the lower surface of the back-surface silicon nitride antireflection layer to form several local grooves, wherein the local grooves all extend to the bottom of the p-type silicon substrate, and the depth of the grooving at the bottom of the p-type silicon substrate is 500-1500 nm, and the spacing between the local grooves is 1-3 um, and then preparing the boron source doped layer by screen printing boron source slurry in the local grooves until the lower surface of the boron source doped layer is flush with the lower surface of the p-type silicon substrate, wherein the main components of the boron source slurry comprise boric acid with a concentration of 50%-70% and tributyl borate with a purity of 60%-90%;

S8: performing screen printing on the lower surface of the boron source doped layer in the local grooves to prepare a back-surface metal electrode layer, wherein the back-surface metal electrode layer successively passes through the silicon oxide passivation layer, the aluminum oxide passivation layer and the back-surface silicon nitride antireflection layer; and S9: finally, performing screen printing on the upper surface of the front-surface silicon nitride antireflection layer to prepare a front-surface metal electrode layer.

Further, in step S2, the doping concentration of the phosphorus source doped layer is $10^{16}$-$10^{20}$/cm$^3$.

Further, in step S3, the concentration of ozone during ozone oxidation is 2-20 g/m$^3$.

Further, in step S4, when preparing the front-surface silicon nitride antireflection layer, a PECVD method is used, wherein the nitrogen source is nitric oxide, the plasma power density is 50-250 mW/cm$^2$, and in step S6, when preparing the back-surface silicon nitride antireflection layer, the PECVD method is used, wherein the nitrogen source is nitric oxide, and the plasma power density is 50-250 mW/cm$^2$.

Further, in step S7, a green light source is used for laser grooving, the light spot of the laser is 30-40 nm, and the scribing speed of the laser grooving is 20-30 m/s.

The beneficial effects of the present disclosure are as follows.

1. The present disclosure uses a laser to form several local grooves, and the local grooves successively pass through the back-surface silicon nitride antireflection layer, the aluminum oxide passivation layer and the silicon oxide passivation layer, and are grooved to the bottom of the p-type silicon substrate, and then the boron source slurry is filled in the grooved area to form a high-low junction structure of back surface field, and the composition ratio of the boron source slurry is reasonably prepared to improve the open circuit voltage of the back cell of the bifacial solar cell, and the back-surface metal electrode layer is in ohmic contact with the heavily doped region subjected to laser grooving and printing phosphorus slurry, which reduces the series resistance of the cell, improves the photoelectric conversion efficiency and bifacial ratio of the back cell of the bifacial solar cell without reducing the front-surface efficiency, increases the power generation of the cell assembly of cell, reduces the floor area of the power station, fully utilizes the limited space resources, and saves the silicon substrate material. Tests show that the front-surface efficiency of the cell prepared by the present disclosure is over 22.38%, the bifacial ratio is over 78.4%, and the power generation gain is 5%-15%.

Reference signs: 1-front-surface metal electrode layer, 2-front-surface silicon nitride antireflection layer, 3-phosphorus source doped layer, 4-p-type silicon substrate, 5-boron source doped layer, 6-silicon oxide passivation layer, 7-aluminum oxide passivation layer, 8-back-surface silicon nitride antireflection layer, 9-back-surface metal electrode layer, 10-intrinsic amorphous silicon layer, 11-aluminum back field layer.

DETAILED DESCRIPTION OF EMBODIMENTS

In order to make the objectives, technical solutions and advantages of the present disclosure clearer, the present disclosure will be further described in detail below with reference to the accompanying drawings and embodiments. It should be understood that the specific embodiments described herein are only used to explain the present disclosure, but not to limit the present disclosure.

In the description of the present disclosure, it should be noted orientation or positional relations indicated by terms such as "center", "upper", "lower", "front", "rear", "left", "right", "vertical", "horizontal", "top", "bottom", "inner", and "outer" are based on orientation or positional relations as shown in the accompanying drawings, merely for facilitating the description of the present disclosure and simplifying the description, rather than indicating or implying that related devices or elements have to be in the specific orientation, or configured or operated in a specific orientation, therefore, they should not be construed as limitations on the present disclosure.

The features and performances of the present disclosure may be further described in detail below in conjunction with the embodiments.

Example 1

Figure 1:
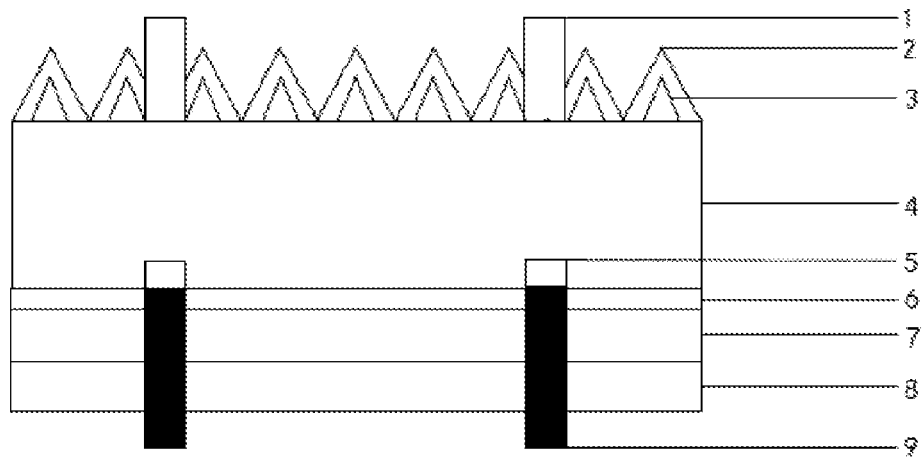
FIG. 1 is a structural schematic view of a p-type bifacial solar cell with partial rear surface field passivation of the present disclosure.

As shown in FIG. 1, this embodiment provides a p-type bifacial solar cell with partial rear surface field passivation, which comprises a p-type silicon substrate 4, wherein the bottom of the p-type silicon substrate 4 is provided with a silicon oxide passivation layer 6, an aluminum oxide passivation layer 7 and a back-surface silicon nitride antireflection layer 8 from top to bottom, several boron source doped layers 5 are embedded in the bottom of the p-type silicon substrate 4, and the bottom of the boron source doped layers 5 is connected with a back-surface metal electrode layer 9 that penetrates through the silicon oxide passivation layer 6, the aluminum oxide passivation layer 7 and the back-surface silicon nitride antireflection layer 8, simultaneously.

Several boron source doped layers 5 are embedded in the bottom of the p-type silicon substrate 4, thereby forming a high-low junction structure of back surface field, which improves the open circuit voltage of the back cell of the bifacial solar cell, and the back-surface metal electrode layer 9 is in ohmic contact with the boron source doped layers 5, which reduces the series resistance of the cell, improves the photoelectric conversion efficiency and bifacial ratio of the back cell of the bifacial solar cell without reducing the front-surface efficiency, increases the power generation of the cell assembly of cell, reduces the floor area of the power station, fully utilizes the limited space resources, and saves the silicon substrate material. Tests show that the front-surface efficiency of the cell prepared by the present disclosure is over 22.38%, the bifacial ratio is over 78.4%, and the power generation gain is 5%-15%.

As a preferred technical solution of the present embodiment:

the top of the p-type silicon substrate 4 is successively provided with a phosphorus source doped layer 3 and a front-surface silicon nitride antireflection layer 2 from bottom to top, the upper surface of the phosphorus source doped layer 3 is provided with several front-surface metal electrode layers 1 one-to-one corresponding to the positions of the boron source doped layers 5, the front-surface metal electrode layers 1 all penetrate through the front-surface silicon nitride antireflection layer 2.

As a preferred technical solution of the present embodiment:

the front-surface metal electrode layer 1 and the back-surface metal electrode layer 9 are both made of Ag or Ag alloy, or Cu or alloy formed by Cu and at least one of Mo, W, Ti, Ni, Al, Mg, Ta, Sn, which all meet the usage requirements.

As a preferred technical solution of the present embodiment:

the thickness of the p-type silicon substrate 4 is 100-180 um, the thickness of the phosphorus source doped layer 3 is 300-500 nm, the thickness of the front-surface silicon nitride antireflection layer 2 is 60-100 nm, the thickness of the silicon oxide passivation layer 6 is 1-5 nm, and the thickness of the aluminum oxide passivation layer 7 is 2-10 nm, the thickness of the back-surface silicon nitride antireflection layer 8 is 100-150 nm, and the thickness of the boron source doped layer 5 is 500-1500 nm, the line width of the electrode grids of the back-surface metal electrode layer 9 and the front-surface metal electrode layer 1 is 40-80 um, and the height thereof is 25-50 um, which optimizes the thickness of each layer to improve cell performance.

The principles of the present disclosure can also be applied to single-sided solar cells, as shown in Example 2 below.

Example 2

Figure 2:
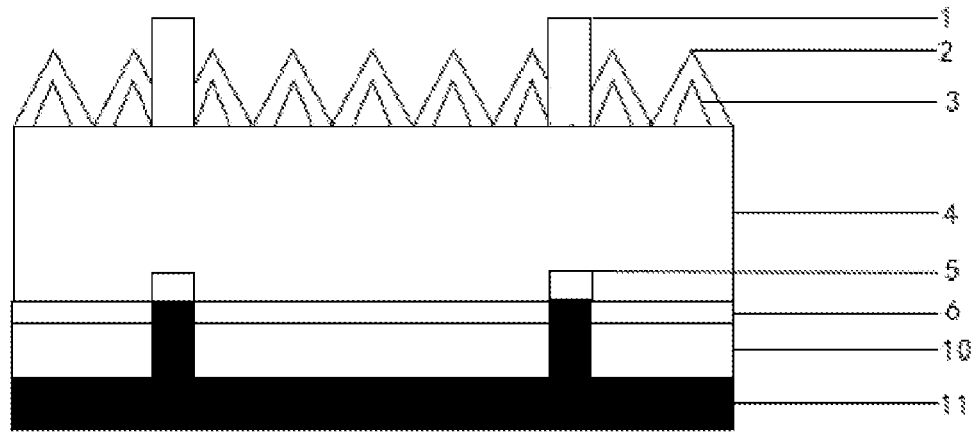
FIG. 2 is a structural schematic view of the p-type single-sided solar cell with partial rear surface field passivation in Example 2.

As shown in FIG. 2, the present embodiment provides a p-type single-sided solar cell with partial rear surface field passivation, which comprises a p-type silicon substrate 4, the bottom of the n-type silicon substrate is provided with a silicon oxide passivation layer 6 and an intrinsic amorphous silicon layer 10 from top to bottom, several boron source doped layers 5 are embedded in the bottom of the n-type silicon substrate, and the bottom of the phosphorus source doped layer 3 is connected with an aluminum back field layer 11 that penetrates through the silicon oxide passivation layer 6 and the intrinsic amorphous silicon layer 10, simultaneously, and the aluminum back field layer 11 extends to cover the lower surface of the intrinsic amorphous silicon layer 10, and the top of the n-type silicon substrate is successively provided with a phosphorus source doped layer 3 and a front-surface silicon nitride antireflection layer 2 from bottom to top, the upper surface of the phosphorus source doped layer 3 is provided with several front-surface metal electrode layers 1 one-to-one corresponding to the positions of the boron source doped layers 5, the front-surface metal electrode layers 1 all penetrate through the front-surface silicon nitride antireflection layer 2.

Example 3

As shown in FIG. 1, the present embodiment provides a preparation method for a p-type bifacial solar cell with partial rear surface field passivation, which comprises the following steps:

S1: selecting a p-type silicon substrate 4, cleaning the p-type silicon substrate 4, and performing surface polishing;

S2: performing low-pressure thermal diffusion on the upper surface of the p-type silicon substrate 4 to prepare a phosphorus source doped layer 3;

S3: performing ozone oxidation on the lower surface of the p-type silicon substrate 4 to grow a silicon oxide passivation layer 6;

S4: preparing a front-surface silicon nitride antireflection layer 2 on the upper surface of the phosphorus source doped layer 3;

S5: preparing an aluminum oxide passivation layer 7 on the lower surface of the silicon oxide passivation layer 6;

S6: preparing a back-surface silicon nitride antireflection layer 8 on the lower surface of the aluminum oxide passivation layer 7;

S7: using a laser on the lower surface of the back-surface silicon nitride antireflection layer 8 to form several local grooves, wherein the local grooves are all grooved to the bottom of the p-type silicon substrate 4, and the depth of the grooving at the bottom of the p-type silicon substrate 4 is 500-1500 nm, and the spacing between the local grooves is 1-3 um, and then preparing the boron source doped layer 5 by screen printing boron source slurry in the local grooves until the lower surface of the boron source doped layer 5 is flush with the lower surface of the p-type silicon substrate 4, and the main components of the boron source slurry comprise boric acid with a concentration of 50%-70% and tributyl borate with a purity of 60%-90%;

S8: performing screen printing on the lower surface of the boron source doped layer 5 in the local groove to prepare a back-surface metal electrode layer 9, and the back-surface metal electrode layer 9 successively passes through the silicon oxide passivation layer 6, the aluminum oxide passivation layer 7 and the back-surface silicon nitride antireflection layer 8; and S9: finally, performing screen printing on the upper surface of the front-surface silicon nitride antireflection layer 2 to prepare a front-surface metal electrode layer 1.

Further, in step S2, the doping concentration of the phosphorus source doped layer 3 is $10^{16}$-$10^{20}$/cm$^3$.

Further, in step S3, the concentration of ozone during ozone oxidation is 2-20 g/m$^3$.

Further, in step S4, when preparing the front-surface silicon nitride antireflection layer 2, a PECVD method is used, wherein the nitrogen source is nitric oxide, the plasma power density is 50-250 mW/cm$^2$, and in step S6, when preparing the back-surface silicon nitride antireflection layer 8, the PECVD method is used, wherein the nitrogen source is nitric oxide, and the plasma power density is 50-250 mW/cm$^2$.

Further, in step S7, a green light source is used for laser grooving, the light spot of the laser is 30-40 nm, and the scribing speed of the laser grooving is 20-30 m/s.

The preparation method for the p-type single-sided solar cell with partial rear surface field passivation in Example 2 has the same principle as that of above-mentioned Example 3.

The above are only preferred embodiments of the present disclosure, and are not intended to limit the present disclosure, the scope of protection of the present disclosure is subject to the claims, any equivalent structural changes made by using the description and accompanying drawings of the present disclosure, similarly, all should be included in the protection scope of the present disclosure.

What is claimed is:

1. A preparation method for a p-type bifacial solar cell with partial rear surface field passivation, comprising following steps:

S1: selecting a p-type silicon substrate, cleaning the p-type silicon substrate, and performing surface polishing;

S2: performing low-pressure thermal diffusion on an upper surface of the p-type silicon substrate to prepare a phosphorus source doped layer;

S3: performing ozone oxidation on a lower surface of the p-type silicon substrate to grow a silicon oxide passivation layer;

S4: preparing a front-surface silicon nitride antireflection layer on an upper surface of the phosphorus source doped layer;

S5: preparing an aluminum oxide passivation layer on a lower surface of the silicon oxide passivation layer;

S6: preparing a back-surface silicon nitride antireflection layer on a lower surface of the aluminum oxide passivation layer;

S7: using a laser on a lower surface of the back-surface silicon nitride antireflection layer to form several local grooves, wherein the several local grooves are all grooved to the lower surface of the p-type silicon substrate, and a depth of the several local grooves measured from the lower surface of the p-type silicon substrate is in the range of 500 nm-1500 nm, and a spacing between the several local grooves is in the range of 1 um-3 um, and then preparing boron source doped layers by screen printing boron source slurry in the several local grooves until a lower surface of the boron source doped layers is flush with the lower surface of the p-type silicon substrate, and main components of the boron source slurry comprise boric acid with a concentration of 50%-70% and tributyl borate with a purity of 60%-90%;

S8: performing screen printing on the lower surface of the boron source doped layers in the several local grooves to prepare a back-surface metal electrode layer, wherein the back-surface metal electrode layer successively passes through the silicon oxide passivation layer, the aluminum oxide passivation layer and the back-surface silicon nitride antireflection layer; and S9: performing screen printing, on an upper surface of the front-surface silicon nitride antireflection layer to prepare a front-surface metal electrode layer.

2. The preparation method for a p-type bifacial solar cell with partial rear surface field passivation according to claim 1, wherein in step S2, a doping concentration of the phosphorus source doped layer is $10^{16}/cm^3$-$10^{20}/cm^3$.

3. The preparation method for a p-type bifacial solar cell with partial rear surface field passivation according to claim 1, wherein in step S3, a concentration of ozone during the ozone oxidation is 2 $g/m^3$-20 $g/m^3$.

4. The preparation method for a p-type bifacial solar cell with partial rear surface field passivation according to claim 1, wherein in step S4, when preparing the front-surface silicon nitride antireflection layer, a PECVD method is used, wherein a nitrogen source is nitric oxide, and a plasma power density is 50 $mW/cm^2$-250 $mW/cm^2$, and in step S6, when preparing the back-surface silicon nitride antireflection layer, the PECVD method is used, wherein a nitrogen source is nitric oxide, and a plasma power density is 50 $mW/cm^2$-250 $mW/cm^2$.

5. The preparation method for a p-type bifacial solar cell with partial rear surface field passivation according to claim 1, wherein in step S7, a green light source is used for laser grooving, a light spot of a laser is 30 nm-40 nm, and a scribing speed of the laser grooving is 20 m/s-30 m/s.

* * * * *